United States Patent [19]

Lee

[11] Patent Number: 5,413,944
[45] Date of Patent: May 9, 1995

[54] TWIN TUB CMOS PROCESS

[75] Inventor: David Lee, Hsin Chu City, Taiwan, Prov. of China

[73] Assignee: United Microelectronics Corporation, Hsin Chu, Taiwan, Prov. of China

[21] Appl. No.: 239,426

[22] Filed: May 6, 1994

[51] Int. Cl.⁶ .......................................... H01L 21/70
[52] U.S. Cl. ..................................... 437/34; 437/56; 437/57; 437/69
[58] Field of Search ....................... 437/26, 34, 56, 57, 437/69

[56] References Cited

U.S. PATENT DOCUMENTS

| | | | |
|---|---|---|---|
| 4,276,688 | 7/1981 | Hsu | 29/571 |
| 4,435,896 | 3/1984 | Parrillo et al. | 29/571 |
| 4,525,920 | 7/1985 | Jacobs et al. | 437/57 |
| 5,024,961 | 6/1991 | Lee et al. | 437/57 |
| 5,036,019 | 7/1991 | Yamane et al. | 437/34 |
| 5,283,200 | 1/1994 | Okamoto | 437/57 |

FOREIGN PATENT DOCUMENTS

| | | | |
|---|---|---|---|
| 0087340 | 7/1981 | Japan . | |
| 0133921 | 5/1990 | Japan | 437/56 |
| 0009558 | 1/1991 | Japan | 437/56 |

*Primary Examiner*—Tom Thomas
*Attorney, Agent, or Firm*—George O. Saile; Stephen B. Ackerman

[57] ABSTRACT

A method of manufacturing a twin-tub structure for a CMOS (Complementary Metal Oxide Semicondcuctor) device is described. A first conductivity-imparting dopant is implanted in a silicon substrate. A photoresist layer is formed over a portion of the silicon substrate, to act as a mask. A portion of the top surface of the silicon substrate is removed in the region not masked by the photoresist layer. A second conductivity-imparting dopant, of an opposite type to the first conductivity-imparting dopant, is implanted into the region of the silicon substrate not masked by the photoresist layer. The photoresist layer is removed. A first insulating layer is formed over the silicon substrate. A second insulating layer is formed over the first insulating layer. The second insulating layer is patterned to form an active region mask centrally located over the planned location of each tub of the twin tub structure. Tubs are formed in the silicon substrate. Field oxide regions are formed in and on the surface of the silicon substrate, between the active region masks. The remainder of the second insulating layer is removed. A third conductivity-imparting dopant, of the same type as the second conductivity-imparting dopant, is implanted into the same region as the second conductivity-imparting dopant.

25 Claims, 4 Drawing Sheets

TWIN TUB CMOS PROCESS

BACKGROUND OF THE INVENTION (1) Field of the Invention

This invention relates to a method manufacturing a semiconductor device, and more particularly to a method of forming a twin-tub structure for a CMOS (Complementary Metal Oxide Semiconductor) device.

(2) Description of the Related Art

In the formation of CMOS field effect transistor (FET) integrated circuits, in a semiconductor substrate, it is necessary to provide regions in the substrate tailored for each type of transistor. For example, in the case of CMOS FET's, the P-channel devices must be located in regions having an N type doping, and the N-channel devices must be located in regions having a P type doping. There are three approaches to forming the two different substrate dopings: (1) P tub or well, (2) N tub or well, and (3) twin tub or well processes.

The most preferred of the three processes is the twin tub or well process, particularly for very high density integrated circuits with feature sizes of one micrometer or below. The primary advantage of the twin tub is that the process allows the doping profile in each tub or well region to be independently tailored for optimum device characteristics. The substrate itself can be either lightly doped P or N type.

Workers in the art have been active in developing twin tub processes. One example is Parrillo et al U.S. Pat. No. 4,435,896. An N tub is formed in one portion of a lightly doped silicon substrate by implantation while masking the future P tub region with an oxide/nitride mask. The mask is removed, and a thick oxide is grown over the N tub, which acts as a mask for the implant to form the P tub, which is self-aligned with the N tub. The tubs are driven in by a diffusion step, and thick field oxide regions formed using the LOCOS (Local Oxidation of Silicon) technique. However, the LOCOS process has many furnace processes such as formation of a buffer oxide, nitride deposition, and field oxidation. This increases machine loading and process cycle time. For example, formation of a 300 Angstrom buffer oxide requires about 30 minutes, a 1500 Angstrom nitride deposited by Low Pressure Chemical Vapor Deposition (LPCVD) takes approximately 90 minutes, and a 5000 Angstrom thick field oxide requires between three and eight hours.

SUMMARY OF THE INVENTION

It is therefore an object of the invention to provide a cost-effective and manufacturable method for producing a self-aligned twin tub for a CMOS device that requires a single masking step, and provides fast cycle time.

These objects are achieved by first implanting a first conductivity-imparting dopant in a silicon substrate. A photoresist layer is formed over a portion of the silicon substrate, to act as a mask. A portion of the top surface of the silicon substrate is removed in the region not masked by the photoresist layer. A second conductivity-imparting dopant, of an opposite type to the first conductivity-imparting dopant, is implanted into the region of the silicon substrate not masked by the photoresist layer. The photoresist layer is removed. A first insulating layer is formed over the silicon substrate. A second insulating layer is formed over the first insulating layer. The second insulating layer is patterned to form an active region mask centrally located over the planned location of each tub of the twin tub structure. Tubs are formed in the silicon substrate. Field oxide regions are formed in and on the surface of the silicon substrate, between the active region masks. The remainder of the second insulating layer is removed. A third conductivity-imparting dopant, of the same type as the second conductivity-imparting dopant, is implanted into the same region as the second conductivity-imparting dopant.

DESCRIPTION OF THE PREFERRED EMBODIMENTS

Figure 1:
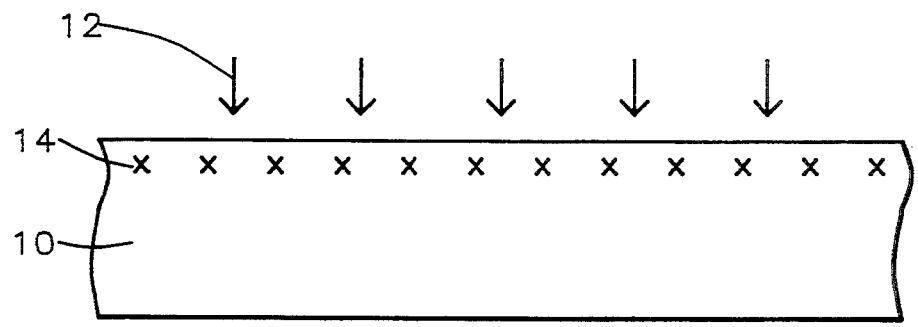
FIGS. 1 to 8 are a cross-sectional view of the method of the invention for forming a self-aligned twin tub structure for a CMOS device.

Referring now to FIG. 1, there is illustrated a monocrystalline (100) oriented silicon substrate 10 having a low doping concentration of P or N type as is well known in the art. An epitaxial layer (not shown) may or may not be formed upon the active, upper surface of the substrate. A first ion implantation, as indicated by arrows 12, is performed, in which an N type dopant such as phosphorus or arsenic is implanted at a dosage of between about 5 E 12 and 2 E 13 atoms/cm.2, and at an energy of between about 50 and 100 KeV. The implanted ions 14 are shown near the top surface of substrate 10.

Figure 2:
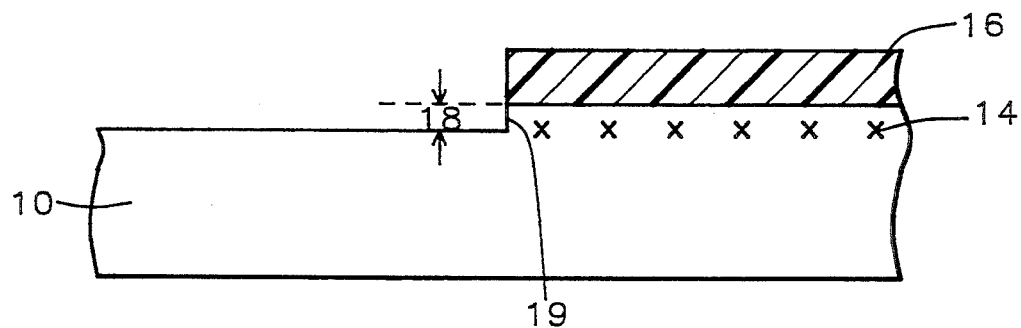

With reference to FIG. 2, a photoresist mask 16 is formed by conventional lithography, with the edge of the mask formed over the boundary of the to-be-formed twin tubs. A portion of the top surface of substrate 10 is removed by dry etching in CF4+O2 (carbon tetrafluoride and oxygen) for between about 0.5 and 1 minute. Alternately, this etch may be performed by wet etch technology, for example, using HNO3 (nitric acid)+HF (hydrofluoric acid) buffered with CH3COOH (acetic acid). A thickness 18 of between about 1500 and 2500 Angstroms are removed by this etch. This removes a substantial portion of the implanted N-type dopants in the un-masked area, and also causes a step 19 to be formed, which serves as an alignment mark for subsequent photoresist processes.

Figure 3:
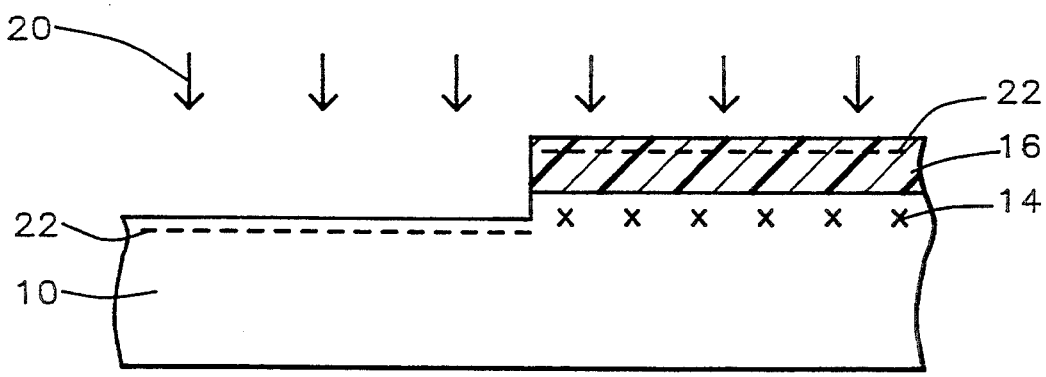
Figure 4:
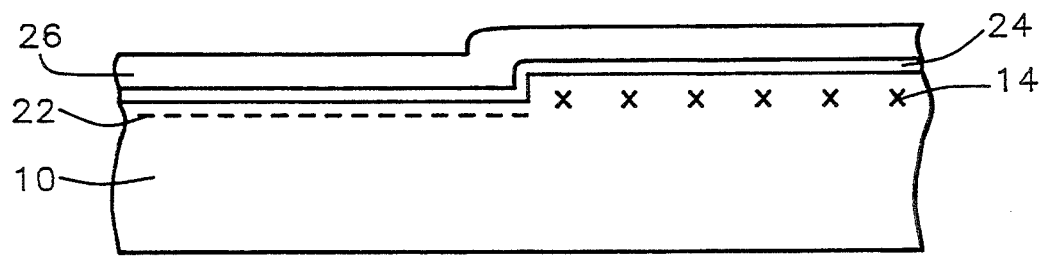

A second ion implantation, as indicated by arrows 20 in FIG. 3, is performed, in which a P type dopant such as boron is implanted at a dosage of between about 5 E 12 and 2 E 13 atoms/cm.2, and at an energy of between about 50 and 150 KeV. The implanted ions 22 are shown near the top surface of substrate 10, and also in Photoresist 16, which is sufficiently thick to prevent implantation through the photoresist and into the area of the substrate under the mask. The photoresist mask 16 is stripped, and, referring now to FIG. 4, a silicon oxide (SiO2) layer 24 is formed upon the active surface of substrate 10. The formation of silicon oxide layer 24 is by, for example, thermal oxidation in a wet oxygen atmosphere at between about 900° and 950° C., for between about 20 and 60 minutes. This results in an oxide thickness of between about 200 and 500 Angstroms. A layer 26 of silicon nitride (Si3N4) is deposited by chemical vapor deposition on top of silicon oxide 24, to a thickness of between about 1000 and 2000 Angstroms. Typical thicknesses for layers 24 and 26 are 300 Angstroms and 1500 Angstroms, respectively.

Figure 5:
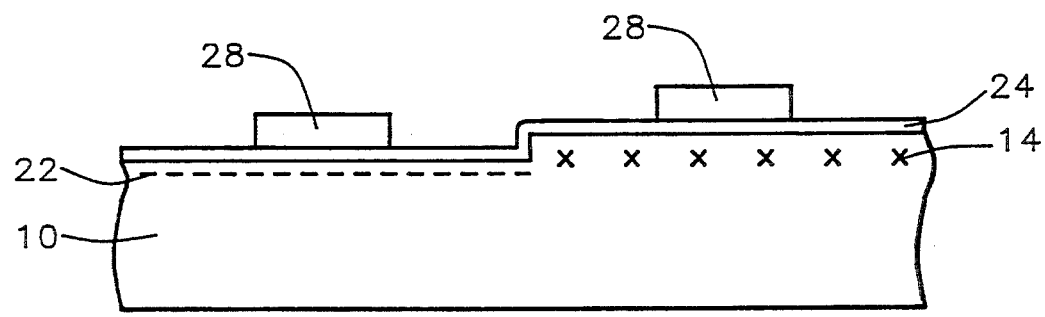
Figure 6:
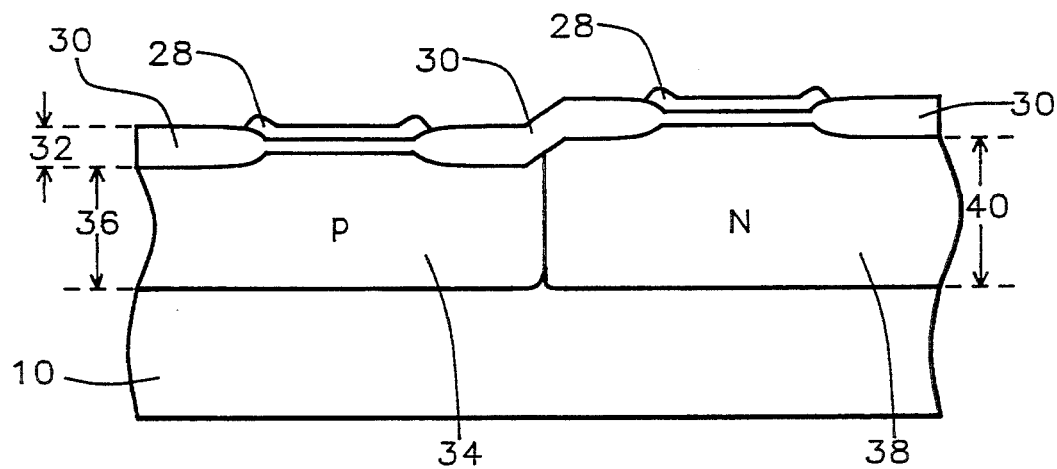

Referring now to FIG. 5, active region masks 28 are formed, centrally located over the tub locations. A photoresist mask (not shown) is formed by conventional lithography, and nitride layer 26 is selectively etched by a dry etch process, to form the masks 28. The photoresist mask is then removed.

The self-aligned twin tubs of the invention are now formed, as well as field oxide regions to provide isolation between the active devices of a CMOS integrated circuit. A first furnace step creates the twin tubs by driving in dopants 14 and 22, by heating to between about 1150° and 1200° C., for between about 6 and 10 hours, in an ambient of N2 (nitrogen)+O2 (oxygen). This results in an initial oxide having a thickness of about 700 Angstroms.

Further oxidation is accomplished by heating in an atmosphere of wet O2 to between about 880° and 980° C., for between about 4 and 8 hours. Field oxide regions 30 have a final thickness 32 of between about 3000 and 8000 Angstroms. P tub 34 has a resultant depth 36 of between about 40000 and 50000 Angstroms, and N tub 38 has a resultant depth 40 of between about 40000 and 50000 Angstroms.

The above method can be altered to perform a conventional LOCOS process first, followed by the well drive-in, or modified to merge LOCOS with the well drive-in, without departing from the spirit and scope of the invention.

Figure 7:
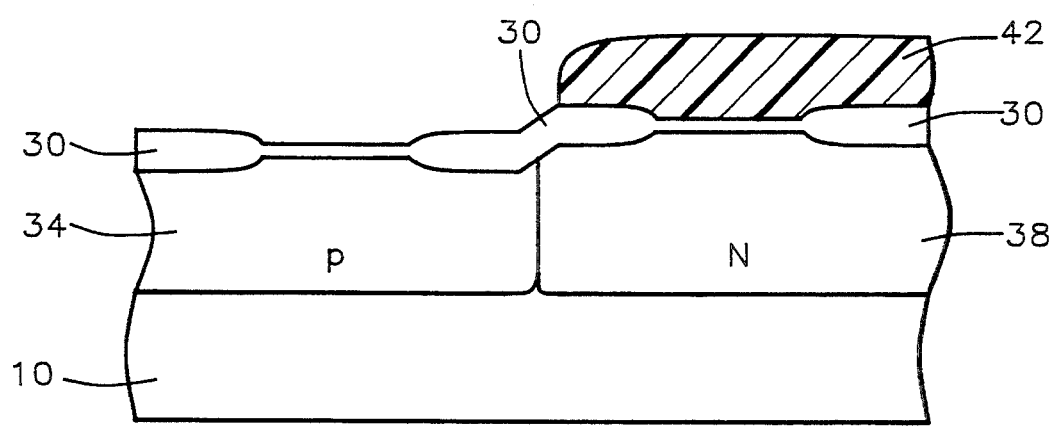
Figure 8:
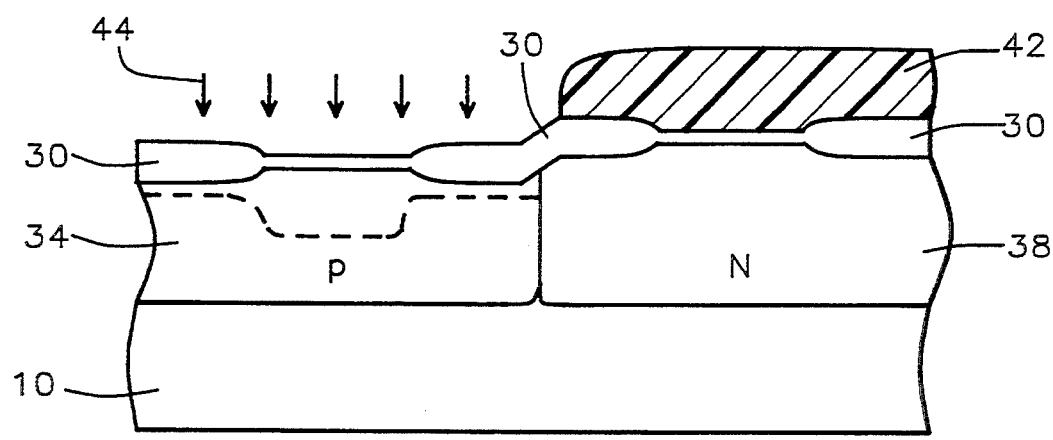

Referring now to FIG. 7, the nitride masks are stripped and a field implant photoresist mask 42 formed over the N tub 38, by conventional lithography. The field implant is indicated in FIG. 8 by arrows 44, representing ion implantation of boron at a dosage of between about 2 E 12 and 8 E 12 atoms/cm.2, and at an energy of between about 150 and 180 KeV. This implant is for the purpose of improving the P field threshold voltage and for latch-up immunity. A similar N-type implant could be performed on the N-well, but is not necessary since the N field threshold is typically sufficient for ordinary applications without such an implant. No drive-in is needed for either of these implants.

Figure 9:
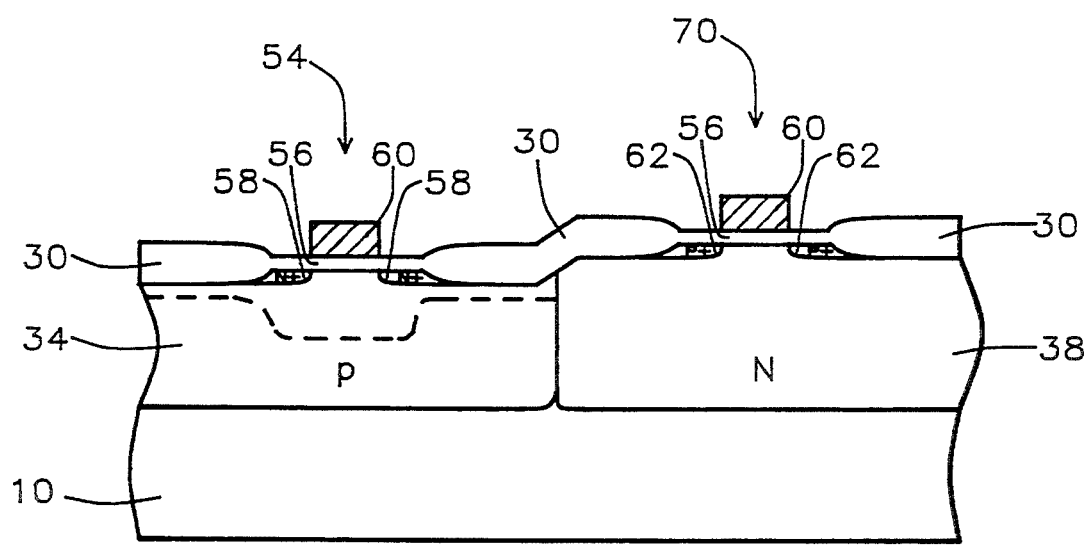
FIG. 9 is a cross-sectional view of a CMOS device consisting of separate N-channel and P-channel field effect transistors formed in and on the self-aligned twin tub of the invention.

Various types of integrated circuit devices can be formed in the improved twin well structure formed by the method shown in FIGS. 1 through 8. In addition to CMOS field effect transistor devices, complementary bipolar transistor devices, combinations of bipolar and CMOS field effect transistor devices, and the like may be formed, as is well recognized by those skilled in the art. FIG. 9 shows the formation of a CMOS device. Details of the formation of the CMOS structure are not given, as they are not important to the invention and are well-known in the art. Shown are an N-channel device 54, consisting of source/drain regions 58, gate oxide 56, and conductive gate 60 typically formed of doped polysilicon, formed in the P tub 34 of the invention. Also shown are an P-channel device 70, consisting of source/drain regions 62, gate oxide 56, and gate 60, in N tub 38. Subsequent layers and structures (not shown) would be formed to complete the integrated circuit, including a thick insulating layer, contact openings, a metallization system for connecting the devices and input/output terminals, and passivation.

While the invention has been particularly shown and described with reference to the preferred embodiments thereof, it will be understood by those skilled in the art that various changes in form and details may be made without departing from the spirit and scope of the invention.

What is claimed is:

1. A method of forming a self-aligned twin tub structure for a CMOS (Complementary Metal Oxide Semiconductor) device, comprising the steps of:
   implanting a first conductivity-imparting dopant in a silicon substrate;
   forming a photoresist layer over a portion of said silicon substrate, to act as a mask;
   removing a portion of the top surface of said silicon substrate in the region not masked by said photoresist layer;
   implanting a second conductivity-imparting dopant, of an opposite type to said first conductivity-imparting dopant, into the region of said silicon substrate not masked by said photoresist layer;
   removing said photoresist layer;
   forming a first insulating layer over said silicon substrate;
   forming a second insulating layer over said first insulating layer;
   patterning said second insulating layer to form an active region mask centrally located over the planned location of each tub of said self-aligned twin tub structure;
   forming tubs in said silicon substrate;
   forming field oxide regions in and on the surface of said silicon substrate, between said active region masks, whereby said field oxide regions are partially formed during said forming tubs;
   removing remainder of said second insulating layer; and
   implanting a third conductivity-imparting dopant, of the same type as said second conductivity-imparting dopant, into the same region as said implanting a second conductivity-imparting dopant.

2. The method of claim 1 wherein said removing a portion of the top surface of said silicon substrate is by a dry etch, removing between about 1500 and 2500 Angstroms of said top surface.

3. The method of claim 2 wherein said dry etch is accomplished by etching with carbon tetrafluoride ($CF_4$) and oxygen ($O_2$) for between about 0.5 and 1 minute.

4. The method of claim 1 wherein said removing a portion of the top surface of said silicon substrate is by a wet etch, removing between about 1500 and 2500 Angstroms of said top surface, by etching in nitric acid ($HNO_3$) and hydrofluoric acid (HF) buffered with acetic acid ($CH_3COOH$).

5. The method of claim 1 wherein said first conductivity-imparting dopant is phosphorus and is implanted at a dosage of between about 5 E 12 and 2 E 13 atoms/cm.2 and an energy of between about 50 and 100 KeV.

6. The method of claim 1 wherein said second conductivity-imparting dopant is boron and is implanted at a dosage of between about 5 E 12 and 2 E 13 atoms/cm.2 and an energy of between about 50 and 150 KeV.

7. The method of claim 1 wherein said third conductivity-imparting dopant is boron and is implanted at a dosage of between about 2 E 12 and 8 E 12 atoms/cm.2 and an energy of between about 150 and 180 KeV.

8. The method of claim 1 wherein said first insulating layer is silicon oxide ($SiO_2$) and is formed to a thickness of between about 200 and 500 Angstroms, by thermal oxidation in a wet oxygen atmosphere at between about 900° and 950° C. for between about 20 and 60 minutes.

9. The method of claim 1 wherein said second insulating layer is silicon nitride and is formed to a thickness of between about 1000 and 2000 Angstroms, by chemical vapor deposition.

10. The method of claim 1 wherein said forming tubs is by first heating said silicon substrate to a temperature of between about 1150° and 1200° C. for between about 6 and 10 hours in an atmosphere of nitrogen ($N_2$) and oxygen ($O_2$).

11. The method of claim 10 wherein said forming field oxide regions is by said first heating said silicon substrate, and further comprising a second heating of said silicon substrate, to a temperature of between about 880° and 980° C. for between about 4 and 8 hours in an atmosphere of wet oxygen ($O_2$).

12. The method of claim 11 wherein said first heating and said forming field oxide regions creates said field oxide regions with a thickness between about 3000 and 8000 Angstroms.

13. A method of forming a CMOS (Complementary Metal Oxide Semiconductor) device with a self-aligned twin tub structure, comprising the steps of:
   implanting a first conductivity-imparting dopant in a silicon substrate;
   forming a photoresist layer over a portion of said silicon substrate, to act as a mask;
   removing a portion of the top surface of said silicon substrate in the region not masked by said photoresist layer;
   implanting a second conductivity-imparting dopant, of an opposite type to said first conductivity-imparting dopant, into the region of said silicon substrate not masked by said photoresist layer;
   removing said photoresist layer;
   forming a first insulating layer over said silicon substrate;
   forming a second insulating layer over said first insulating layer;
   patterning said second insulating layer to form an active region mask centrally located over the planned location of each tub of said self-aligned twin tub structure;
   forming tubs in said silicon substrate;
   forming field oxide regions in and on the surface of said silicon substrate, between said active region masks, whereby said field oxide regions are partially formed during said forming tubs;
   removing remainder of said second insulating layer;
   implanting a third conductivity-imparting dopant, of the same type as said second conductivity-imparting dopant, into the same region as said implanting a second conductivity-imparting dopant, to act as a field implant; and
   forming n-channel and p-channel field effect transistors in and on said tubs, to complete said CMOS device.

14. The method of claim 13 wherein said removing a portion of the top surface of said silicon substrate is by a dry etch, removing between about 1500 and 2500 Angstroms of said top surface.

15. The method of claim 14 wherein said dry etch is accomplished by etching with carbon tetrafluoride ($CF_4$) and oxygen ($O_2$) for between about 0.5 and 1 minute.

16. The method of claim 13 wherein said removing a portion of the top surface of said silicon substrate is by a wet etch, removing between about 1500 and 2500 Angstroms of said top surface, by etching in nitric acid ($HNO_3$) and hydrofluoric acid (HF) buffered with acetic acid ($CH_3COOH$).

17. The method of claim 13 wherein said first conductivity-imparting dopant is phosphorus and is implanted at a dosage of between about 5 E 12 and 2 E 13 atoms/cm.$^2$ and an energy of between about 50 and 100 KeV, whereby the region formed after said implanting said first conductivity-imparting dopant and forming said tubs is an n-tub.

18. The method of claim 17 wherein said second conductivity-imparting dopant is boron and is implanted at a dosage of between about 5 E 12 and 2 E 13 atoms/cm.$^2$ and an energy of between about 50 and 150 KeV, whereby the region formed after said implanting said second conductivity-imparting dopant and forming said tubs is a p-tub.

19. The method of claim 18 wherein said third conductivity-imparting dopant is boron and is implanted at a dosage of between about 2 E 12 and 8 E 12 atoms/cm.$^2$ and an energy of between about 150 and 180 KeV.

20. The method of claim 19 wherein said n-channel field effect transistor is formed in and on said p-tub, and said p-channel field effect transistor is formed in and on said n-tub.

21. The method of claim 13 wherein said first insulating layer is silicon oxide ($SiO_2$) and is formed to a thickness of between about 200 and 500 Angstroms, by thermal oxidation in a wet oxygen atmosphere at between about 900° and 950° C. for between about 20 and 60 minutes.

22. The method of claim 13 wherein said second insulating layer is silicon nitride and is formed to a thickness of between about 1000 and 2000 Angstroms, by chemical vapor deposition.

23. The method of claim 13 wherein said forming tubs is by first heating said silicon substrate to a temperature of between about 1150° and 1200° C. for between about 6 and 10 hours in an atmosphere of nitrogen ($N_2$) and oxygen ($O_2$).

24. The method of claim 23 wherein said forming field oxide regions is by said first heating said silicon substrate, and further comprising a second heating of said silicon substrate, to a temperature of between about 880° and 980° C. for between about 4 and 8 hours in an atmosphere of wet oxygen ($O_2$).

25. The method of claim 24 wherein said first heating and said forming field oxide regions creates said field oxide regions with a thickness between about 3000 and 8000 Angstroms.

* * * * *